(12) United States Patent
Iwasaki

(10) Patent No.: US 6,524,945 B2
(45) Date of Patent: Feb. 25, 2003

(54) METHOD OF MAKING AN ANTI-REFLECTION STRUCTURE FOR A CONDUCTIVE LAYER IN A SEMICONDUCTOR DEVICE

(75) Inventor: Haruo Iwasaki, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 10/132,213

(22) Filed: Apr. 26, 2002

(65) Prior Publication Data

US 2002/0119643 A1 Aug. 29, 2002

Related U.S. Application Data

(62) Division of application No. 09/689,881, filed on Oct. 13, 2000.

(30) Foreign Application Priority Data

Oct. 15, 1999 (JP) .......................................... 11-293654

(51) Int. Cl.[7] ......................................... H01L 21/4763
(52) U.S. Cl. ...................... 438/636; 438/952; 257/288
(58) Field of Search ......................... 257/288; 438/636, 438/952

(56) References Cited

U.S. PATENT DOCUMENTS 6,281,100 B1 * 8/2001 Yin et al. ................... 438/585

* cited by examiner

*Primary Examiner*—Vu A. Le
*Assistant Examiner*—Christian D. Wilson
(74) *Attorney, Agent, or Firm*—Young & Thompson

(57) ABSTRACT

An anti-reflection structure formed on a gate electrode in a MOSFET device includes a first and second anti-reflection layers sandwiching therebetween a silicon nitride layer. Each of the anti-reflection layers has a two-layer structure including a silicon oxide nitride film and a protective silicon oxide film. The anti-reflection layer structure improves the accuracy of the pattern size for the gate electrode.

6 Claims, 13 Drawing Sheets

METHOD OF MAKING AN ANTI-REFLECTION STRUCTURE FOR A CONDUCTIVE LAYER IN A SEMICONDUCTOR DEVICE

This application is a division of co-pending Application Ser. No. 09/689,881, filed on Oct. 13, 2000, the entire contents of which are hereby incorporated by reference.

BACKGROUND OF THE INVENTION (a) Field of the Invention

The present invention relates to an anti-reflection structure for a conductive layer in a semiconductor device and, more particularly, to an anti-reflection structure suited for forming a conductive layer pattern having an accurate width in a semiconductor device.

(b) Description of the Related Art

With the development of higher integration of semiconductor devices, for example in a MOSFET device, it has become more and more important to form an interconnect pattern having an accurate width, regardless of the situation wherein the line width and the line pitch have become smaller and smaller.

In a MOSFET device, the gate electrodes are generally configured using a photolithographic and etching technique wherein a mask pattern is accurately transferred onto a conductive layer by using an exposure light. In order to prevent the transfer error during the photolithographic step using the exposure light, an anti-reflection layer is generally formed on the conductive layer to be patterned.

Example of using the anti-reflection layer will be described with reference to the process for patterning gate electrodes in DRAM memory cells.

FIG. 1 shows a sectional view of a DRAM memory cell. The memory cell generally designated by numeral 10 includes a silicon substrate 12, an isolation film 14 formed thereon for isolation of device areas, a MOSFET 16 formed in each device area, and a capacitor 18 overlying the MOSFET 16. The MOSFET 16 includes a gate electrode 24 including a gate electrode layer 20, and a silicon nitride layer 22 formed thereon. A side wall structure 26 is formed on both the sides of the gate electrode 24.

A contact plug 28 is disposed in contact with a diffused region (not shown) formed in the surface region of the silicon substrate 12. The gate electrode layer 20 is connected to a word line (not shown). The silicon nitride layer 22 acts as an etch stopper during the etching step for forming a through-hole receiving therein the contact plug 28. The gate electrode 24 is also disposed on the isolation region 14 for convenience of the fabrication process.

The capacitor 18 overlies the MOSFET 16 with an intervention of an interlayer dielectric film 30. The capacitor 18 includes a capacitor contact 32 penetrating the interlayer dielectric film 30 to be in contact with the contact plug 28, a bottom electrode 34 in contact with the capacitor contact 32, and a top electrode 38 opposing the bottom electrode 34 with an intervention of a capacitor insulator film 36.

FIGS. 2A to 2F show consecutive steps for fabrication of the DRAM memory cell 10 of FIG. 1. As shown in FIG. 2A, an element isolation film 14 is formed on a silicon substrate 12 for isolation of device areas, followed by consecutively forming thereon a gate electrode layer 20, a first silicon nitride layer 22, an anti-reflection layer 40 including a lower silicon oxide nitride film 40a and an upper silicon oxide film 40b, and a photoresist film 42.

Subsequently, a gate mask pattern is transferred onto the photoresist film 42, followed by patterning thereof to form an etching mask 44, as shown in FIG. 2B. By using the etching mask 44, as shown in FIG. 2C, the silicon oxide film 40b, the silicon oxide nitride film 40a, silicon nitride layer 22 and the gate electrode layer 20 are selectively etched for patterning, thereby forming a gate electrode structure 46.

A second nitride film is then formed on the entire surface including the gate electrode structure 46, followed by selective etching of the second nitride film to form side walls 26 on the gate electrode structure 46, and etching of the silicon nitride layer 40b and the silicon oxide nitride film 40a to remove the same from the gate electrode structure 46, as shown in FIG. 2D. Thereafter, an interlayer dielectric film 48 made of silicon oxide is deposited and subjected to CMP thereof to obtain a smoothed top surface.

Then, the interlayer dielectric film 48 is selectively etched using a self-alignment contact etching technique having a high selective ratio between the first silicon nitride layer 22 and the interlayer dielectric film 48, whereby through-holes 49 are formed in the interlayer dielectric film 48, as shown in FIG. 2E, to expose the surface regions of the silicon substrate. In the self-alignment contact etching step, the first silicon nitride layer 22 acts an etch stop layer.

Then, a conductive layer is deposited on the entire surface to fill the through-holes 49 and etched-back to obtain contact plugs 28 as shown in FIG. 2F.

Subsequently, as shown in FIG. 1, an interlayer dielectric film 30 is deposited, followed by a known process for forming the capacitor contact 32 and the capacitor 18.

In the above conventional anti-reflection structure, the anti-reflection layer 40 including the silicon oxide nitride film 40a and the silicon nitride layer 40b is formed on the gate electrode layer 20 with an intervention of the silicon nitride layer 22, as detailed in FIG. 3A. As an alternative structure, the anti-reflection layer 40 may be formed between the gate electrode layer 20 and the silicon nitride layer 22, such as shown in FIG. 3B.

In the conventional anti-reflection structure as described above as well as the alternative structure, the thickness of the anti-reflection layer 40 is determined based on several factors including the materials for the gate electrode layer 20, the thickness of the silicon nitride layer 22, and the types and materials for the photoresist film. Thus, it is difficult to determine the optimum value for the thickness for the anti-reflection layer, whereby the conventional anti-reflection layer cannot demonstrate a sufficient function during the exposure.

In other words, there is a problem in the conventional technique in that an inaccurate pattern is transferred onto the photoresist film due to the adverse effects of the reflected light generated during the exposure of the photoresist film. The inaccurate pattern involves irregularity of the gate width in the DRAM memory cells and of the line width in general semiconductor devices.

More specifically, in the anti-reflection structure of FIG. 3A, assuming that the design thickness of the silicon nitride layer 22 is 2000 angstroms, for example, the silicon oxide nitride film 40b should have a thickness of 500 angstroms in order to obtain a minimum variation for the gate width.

In this case, i.e., wherein the silicon oxide nitride film 40b has a thickness of 500 angstroms, the variation of the gate width may be suppressed to within 8 nm if the silicon nitride layer 22 has an exact thickness of 2000 angstroms. However, if the silicon nitride layer 22 has an actual thickness of 1800 or 2200 angstroms, the gate width variation amounts up to 40 nm. A typical case for this example is shown in FIG. 4A, wherein the top surface of the gate electrode layer 20 has an irregularity to cause a depression on the silicon oxide film 40b acting as the underlying layer for the photoresist film 44. This in turn causes an irregularity of the pattern width of the photoresist film 44, wherein the pattern width increases at the depression and decreases at the elevation of the underlying layer.

In the anti-reflection structure of FIG. 3B, assuming similarly that the design thickness of the silicon nitride layer 22 is 2000 angstroms, the silicon oxide nitride film 40b should have a thickness of 500 angstroms in order to obtain a minimum variation for the gate width.

In this case, i.e., wherein the silicon oxide nitride film 40b has a thickness of 500 angstroms, the variation of the gate width may be suppressed to within 8 nm if the silicon nitride film layer 22 has an exact thickness of 2000 angstroms. However, if the silicon nitride layer 22 has an actual thickness of 1800 or 2200 angstroms, the gate width variation amounts up to 50 nm or 54 nm. A typical case for this example is shown in FIG. 4B, wherein the top surface of the gate electrode layer 20 has an irregularity to cause a depression on the silicon nitride layer 22 acting as the underlying layer for the photoresist film 44. This in turn causes the irregularity of the pattern width of the photoresist film 44, wherein the pattern width increases at the depression and decreases at the elevation of the underlying layer.

In the above example, the problem in the anti-reflection structure is described with reference to patterning of a two-layer structure including a gate electrode layer and a silicon nitride layer in a MOSFET device. However, the problem in the anti-reflection structure is common to patterning of any layered structure in semiconductor devices so long as the layered structure includes a conductive layer and an insulator layer.

SUMMARY OF THE INVENTION

It is an object of the present invention to provide an anti-reflection structure for a conductive layer in a semiconductor device, which is capable of suppressing variation of the line width caused by exposure light.

It is another object of the present invention to provide a method for forming an anti-reflection structure in a semiconductor device.

The present invention provides a semiconductor device including a substrate, a conductive layer overlying the substrate, a first anti-reflection layer, a first insulator layer and a second anti-reflection layer consecutively formed on the conductive layer, the conductive layer, first anti-reflection layer, the first insulator layer and the second anti-reflection layer are patterned to have a common pattern.

The present invention also provides a method including the steps of forming a conductive layer overlying a substrate, consecutively forming a first anti-reflection layer, a first insulator layer and a second anti-reflection layer on the conductive layer, forming a mask pattern on the second anti-reflection layer by using a photolithographic technique, and patterning the second anti-reflection layer, the first insulator layer, the first anti-reflection layer and the conductive layer by using the mask pattern.

In accordance with the present invention, each of the first and second anti-reflection layers sandwiching the first insulator layer cancels the reflected light reflected from the other of the first and second anti-reflection layer even in the case of a larger variation for the thickness of the first insulator, layer.

The above and other objects, features and advantages of the present invention will be more apparent from the following description, referring to the accompanying drawings.

PREFERRED EMBODIMENT OF THE INVENTION

The principle of the present invention will be described hereinafter for a better understanding of the present invention with reference to FIGS. 5A and 5B.

Figure 3A:
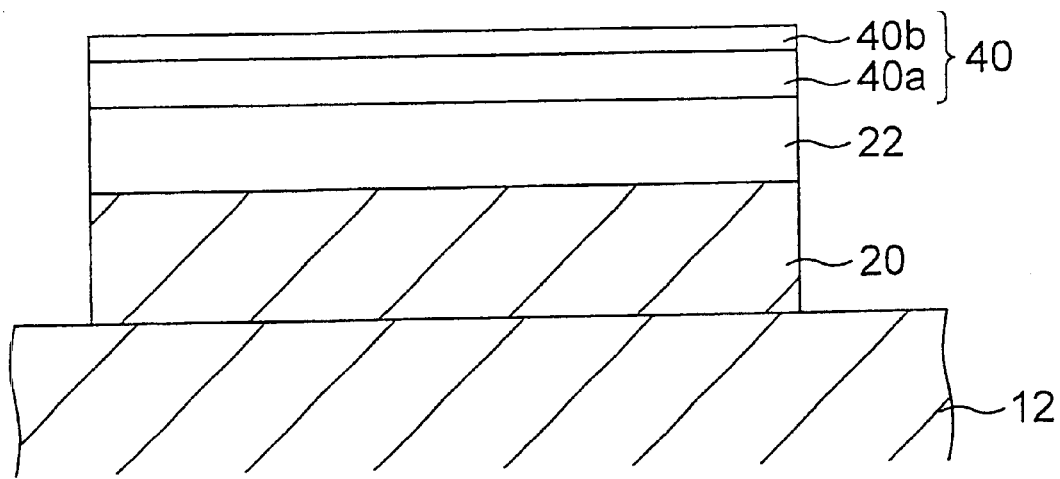
FIG. 3A is a detailed sectional view of the conventional anti-reflection structures shown in FIG. 1
Figure 3B:
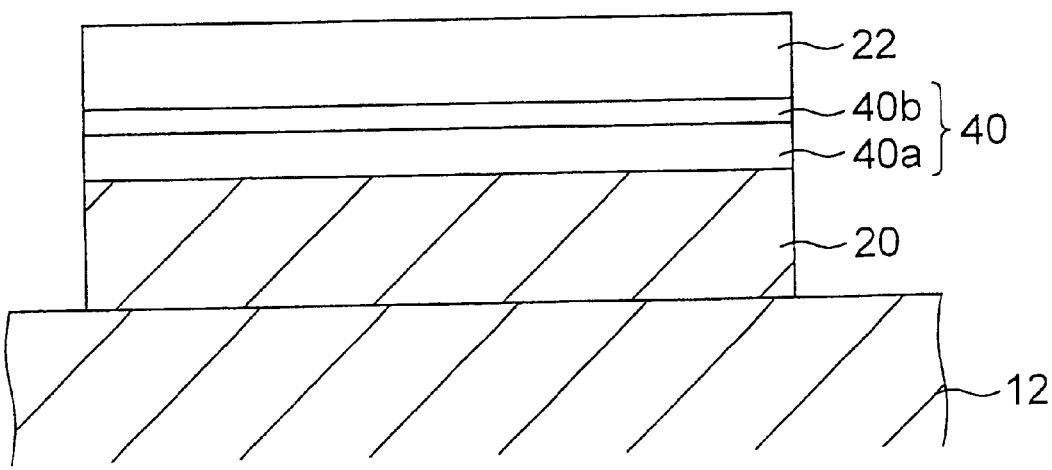
FIG. 3B is a sectional view of a modification thereof.
Figure 4A:
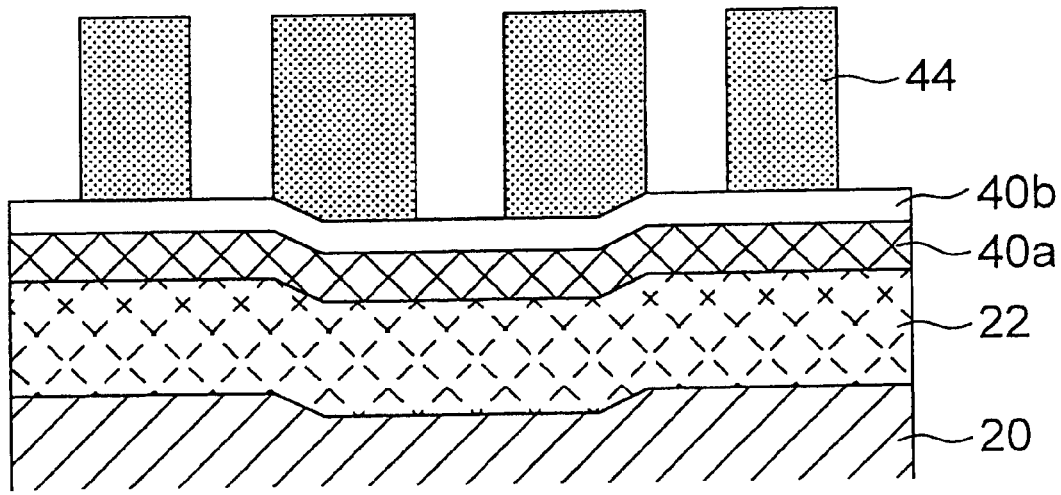
FIGS. 4A and 4B are sectional views illustrating the disadvantage in the conventional anti-reflection structures shown in FIGS. 3A and 3B, respectively.
Figure 4B:
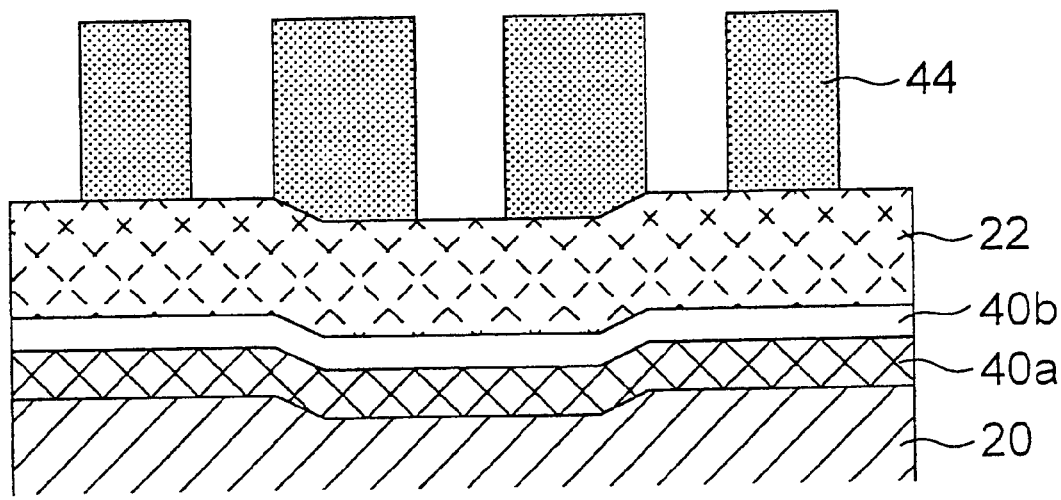
Figure 5A:
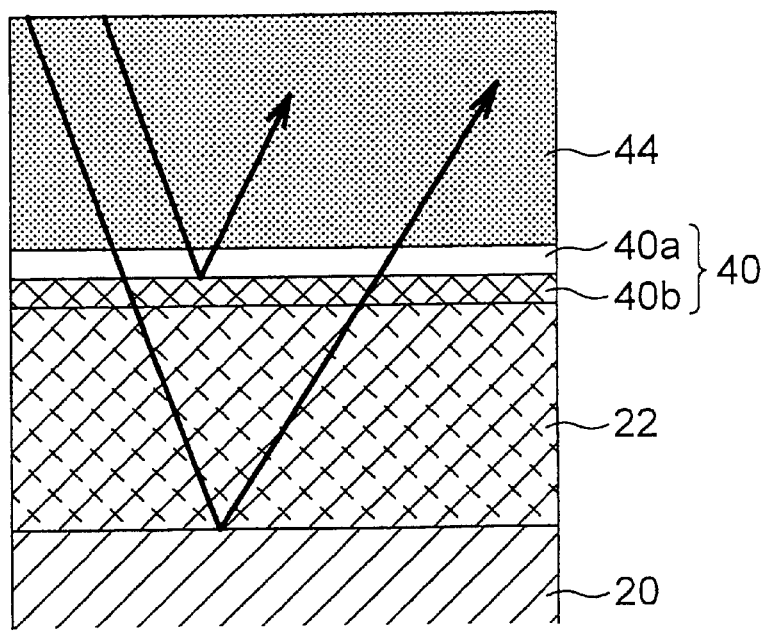
FIG. 5A is a schematic sectional view of the conventional anti-reflection structure showing the function thereof.

The present inventor, after investigating the influences by the reflected light reflected by the conventional anti-reflection structure, noticed that the pattern width variation is caused by the mutual interaction between the light L1 reflected from the anti-reflection layer 40 and the light L2 reflected by the gate electrode layer 20, as illustrated in FIG. 5A. Thus, the thicknesses of the anti-reflection layer 40 and the silicon nitride layer 22 should be controlled so that the light L1 and the light L2 cancel each other. However, in this structure, the variation of the thickness of the silicon nitride layer 22 significantly affects the function of the anti-reflection layer 40. This problem also applies to the anti-reflection structure shown in FIG. 3B.

Figure 5B:
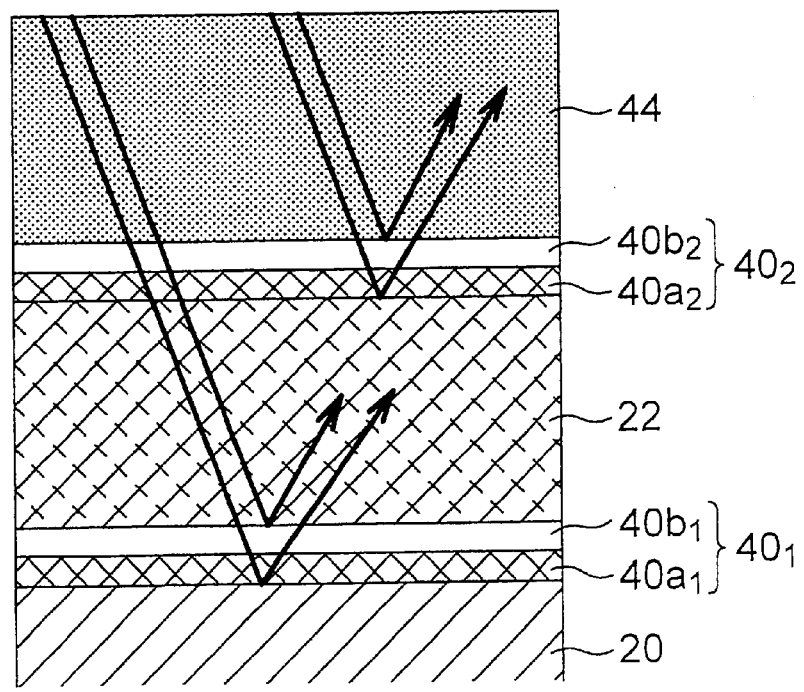
FIG. 5B is a similar schematic sectional view of the anti-reflection structure according to an embodiment of the present invention.

In view of the above, the present inventor devised the anti-reflection structure such as shown in FIG. 5B, wherein a pair of anti-reflection layers 40 are disposed for sandwiching therebetween the silicon nitride layer 22. That is, the first (lower) anti-reflection layer $40_1$ is formed on the gate electrode layer (or conductive layer) 20, and the second (upper) anti-reflection layer $40_2$ is disposed on the silicon nitride layer (or insulator layer) 22, which is subjected to patterning together with the conductive layer 20 by using a photolithographic technique.

Examples of the conductive layer 20 include a gate electrode layer such as made of polysilicon or WSi, and metallic interconnect layer such as made of Al. Examples of the insulator layer 22 include $SiO_2$ film and SiN film. At least one of the pair of anti-reflection layer $40_1$ and $40_2$ preferably has a two-layer structure such as including a silicon oxide nitride film 40a1 or 40a2 and a silicon oxide film 40b1 or 40b2 overlying the silicon oxide nitride film 40a1 or 40a2.

Figure 6:
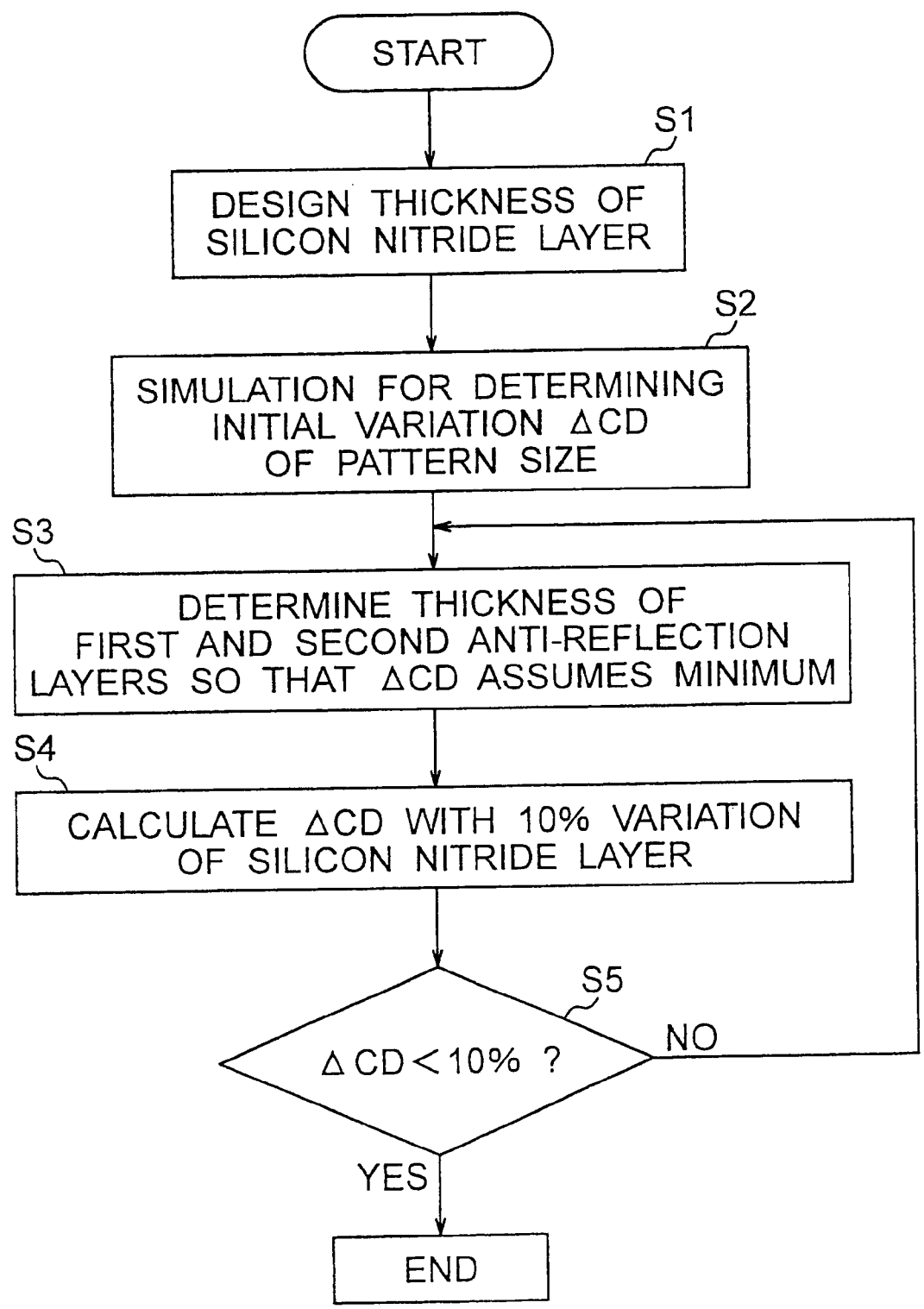
FIG. 6 is a flowchart of a process according to an embodiment of the present invention.

The thickness of the anti-reflection layers $40_1$ and $40_2$ should be designed based on the procedure shown in FIG. 6. In step S1, the thickness of the insulator layer (silicon nitride layer) 22 is determined based on the self-alignment process applied to the insulator layer 22 and the conductive layer 20.

In next step S2, the thicknesses of the first and second anti-reflection layers $40_1$ and $40_2$ are temporarily determined based on the dimensions of the through-holes and the thickness of the insulator layer 22 determined in step S1. The resultant temporary thickness is analyzed by a simulation to determine the initial variation ΔCD of the pattern size of the conductive layer 20 caused by variations of the thickness of the photoresist film.

In next step S3, the thickness of the insulator layer 22 is fixed, and the thicknesses of the first and second anti-reflection layers are calculated so that the variation ΔCD of the pattern size assumes a minimum based on the temporary thickness of the first and second anti-reflection layers and the initial variation ΔCD.

Figure 7A:
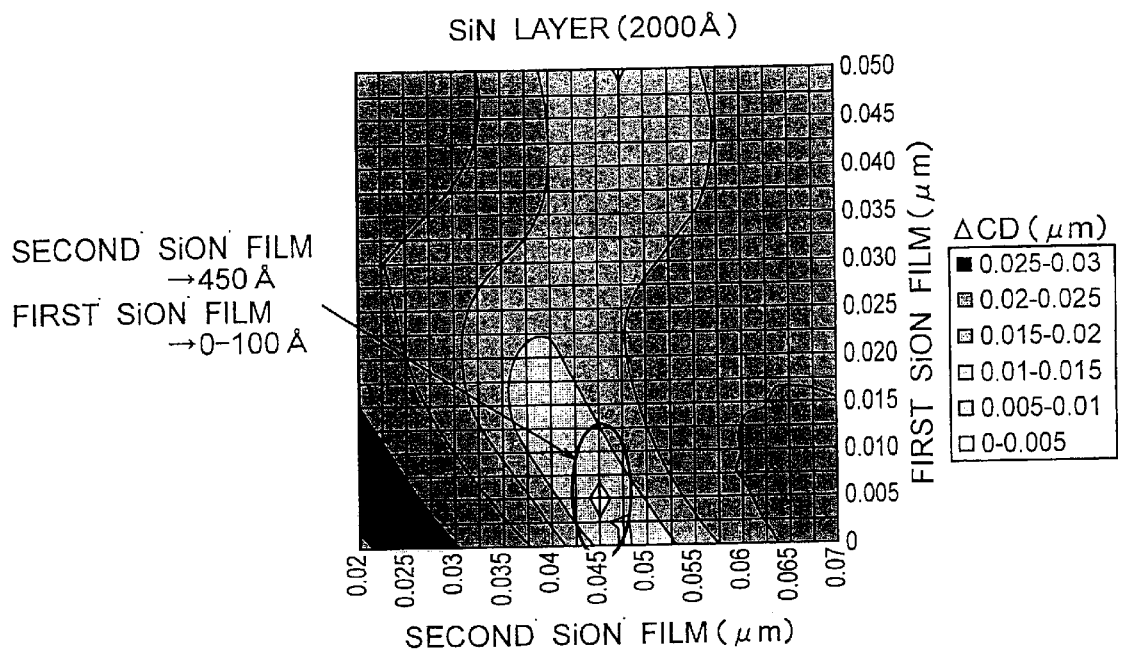
FIGS. 7A and 7B are operational diagrams for calculation of the thickness of the anti-reflection layer according to the embodiment.
Figure 7B:
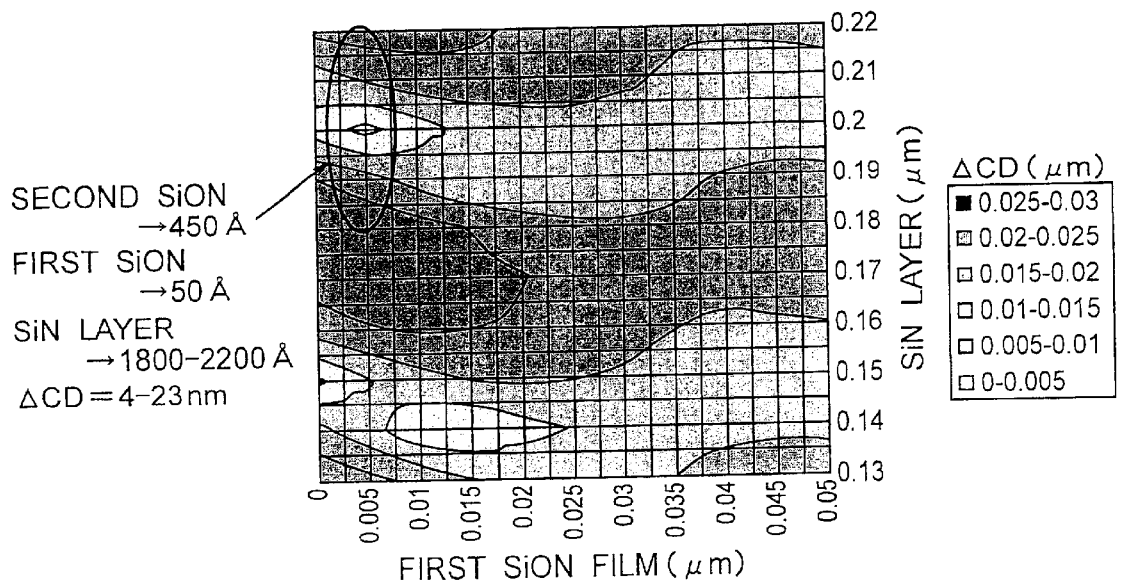

For example, in the exemplified case of this step shown in FIG. 7A wherein the pattern size is 0.25 μm and the thickness of the silicon nitride layer 22 is 2000 angstroms, it is shown that the variation ΔCD assumes a minimum when the thickness of the second reflected SiON film 40a2 is 450 μm and the thickness of the first SiON film 40a1 is between 0 and 100 angstroms.

In next step S4, the variation ΔCD is calculated on the assumption that the thickness of the silicon nitride layer 22 is shifted from 2000 angstroms-by 10%. In an exemplified case of this step shown in FIG. 6B wherein the thickness of the second SiON film 40a2 is 450 angstroms and the thickness of the first SiON film 40a1 is 50 angstroms, the pattern size variation resides between 4 nm and 23 nm, that is, ΔVD is within 10%.

In next step S5, it is judged whether or not the pattern size variation ΔCD is within 10%. If it is affirmative, the temporary thicknesses of the first and second anti-reflection layers are employed as the final thicknesses of the first and second anti-reflection layers. If it is negative, after returning to step S3, the pattern size variation ΔCD is again calculated by assuming difference thicknesses of the first and second anti-reflection layers. In the above example, 10% is used as the allowable variation. However, the allowable variation may be a different suitable value.

In a semiconductor device according to a preferred embodiment of the present invention, the conductive layer 20 and the insulator layer 22 are a gate electrode layer and a silicon nitride layer, respectively. The semiconductor device is implemented by a MOSFET device which includes a plurality of gate electrode structures each having a two-layer structure, and a plurality of through-holes each formed by a self-alignment process using the gate electrode structures. In this example, the silicon nitride layer functions as an etch stop layer for protecting the gate electrode during the self-alignment process for forming the through-holes in an insulator film between the gate electrodes.

At least one of the first and second anti-reflection layers $40_1$ and $40_2$ has a two-layer structure including a silicon oxide nitride film 40a1 or 40a2 and a silicon oxide film 40b1 or 40b2 overlying the silicon oxide nitride film 40a1 or 40a2. The silicon oxide nitride film is generally unstable and liable to change in its property after it is contacted with air. Thus, the silicon oxide film is used as a protective film overlying the silicon oxide nitride film.

The silicon oxide nitride film is suited as a reflecting film due to having a refractive index similar to the refractive index of the photoresist film and to the advantageous property thereof wherein the composition thereof is controlled with ease.

Now, the present invention is more specifically described with reference to a preferred embodiment thereof.

Figure 8:
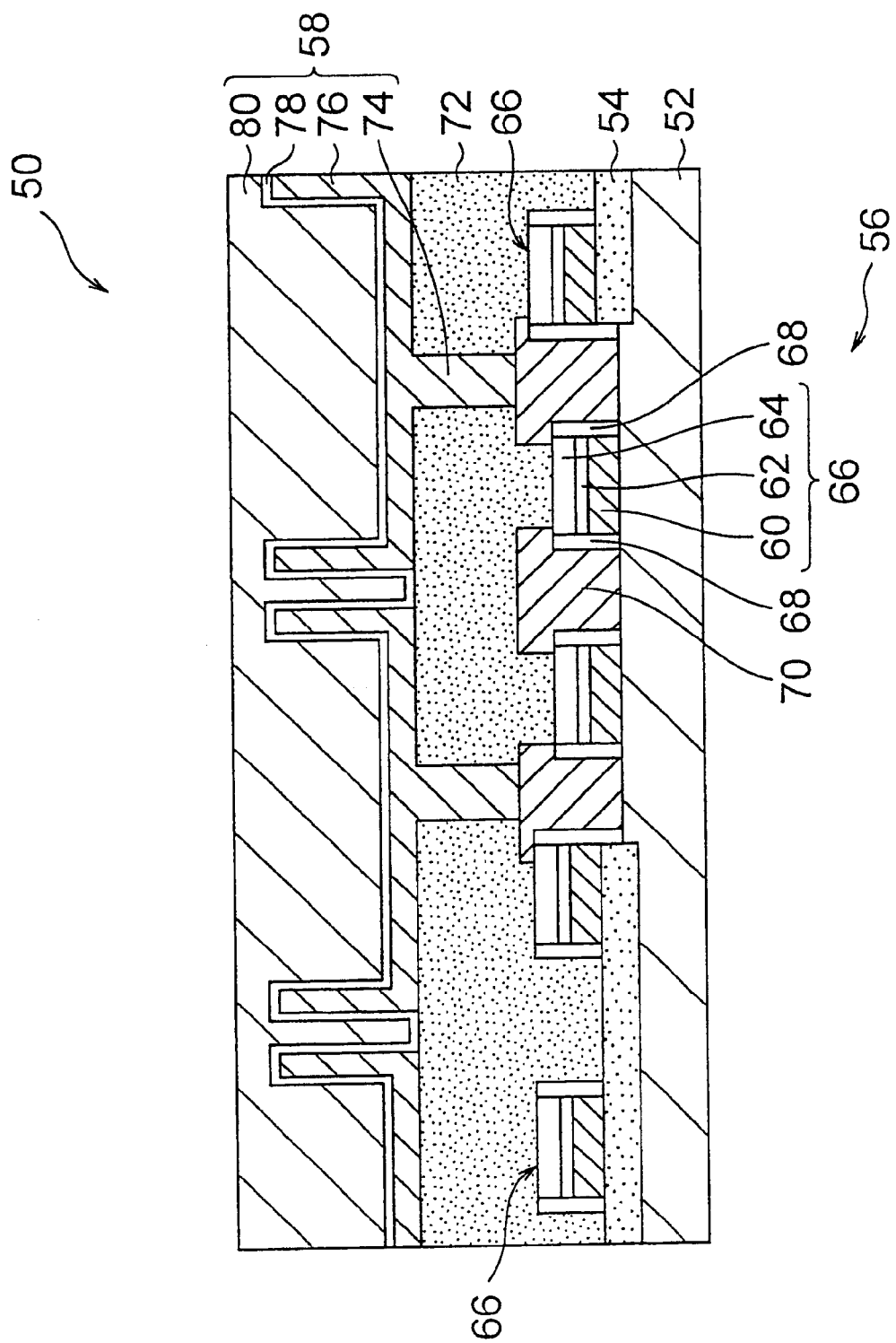
FIG. 8 is a sectional view of a semiconductor device according to an embodiment of the present invention.

Referring to FIG. 8, a semiconductor device according to an embodiment of the present invention is applied to DRAM memory cells. The DRAM memory cell generally designated by numeral 50 includes a silicon substrate 52, an isolation film 54 formed on the silicon substrate 52 for isolating device areas therein, a MOSFET 56 formed in each device area, and a storage capacitor 58 overlying the MOSFET 56 with an intervention of an insulator film 72.

The MOSFET 56 includes source/drain diffused regions (not shown) formed in the surface area of the silicon substrate 52, contact plugs 70 disposed in contact with the source/drain regions, and a gate electrode structure 66 including a gate electrode layer 60, an anti-reflection layer 62 having a two-layer structure and formed on the gate electrode layer 60, a silicon nitride film 64 formed on the anti-reflection layer 62, and side walls 68 formed on both sides of the gate electrode structure 66. The gate electrode layer 60 is connected to a word line not shown.

The silicon nitride layer 64 overlying the gate electrode layer 60 functioned as an etch stop layer during the etching process for forming the through-holes in the insulator layer 72 which receive therein contact plugs 70. The gate electrode structure 66 on the isolation layer 54 is formed for a convenience of the fabrication process of the DRAM memory cells 50.

The capacitor 58 is formed overlying the MOSFET 56 with an intervention of the interlayer dielectric film 72. The capacitor 58 includes a capacitor contact 74 penetrating through the interlayer dielectric film 72 to be in contact with the contact plug 70, a bottom electrode 76 in contact with the capacitor contact 74, and a top electrode 80 opposing the bottom electrode 76 with an intervention of a capacitor insulator film 78.

FIGS. 9A to 9H show a fabrication process for the DRAM memory cell shown in FIG. 8.

Figure 9A:
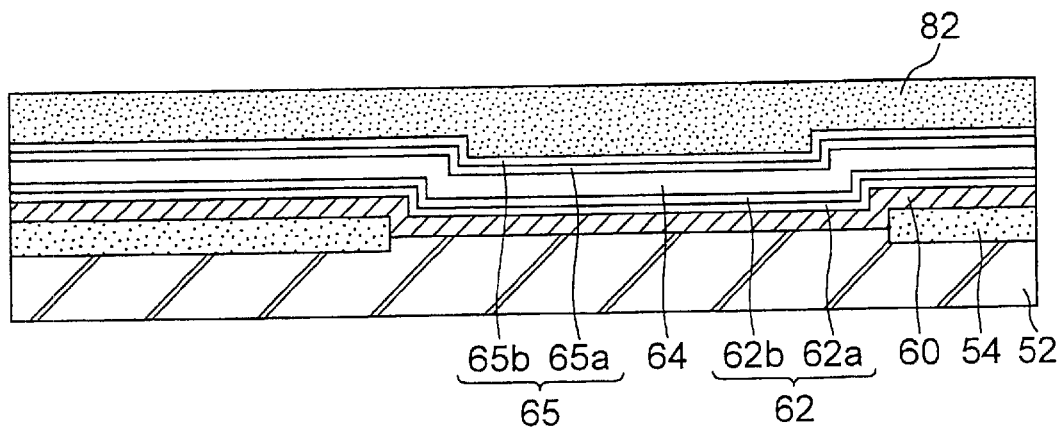
FIGS. 9A to 9H are sectional views of the semiconductor device of FIG. 8 during consecutive steps of fabrication therefor.

In FIG. 9A, an element isolation film 54 is formed on a silicon substrate 52 for isolation of device areas, followed by deposition of a gate electrode layer 60 by sputtering. Subsequently, a silicon oxide nitride film 62a constituting a lower film of the bottom (first) anti-reflection layer 62, a silicon nitride layer 62b constituting an upper film of the bottom anti-reflection layer 62, a silicon nitride layer 64, a silicon oxide nitride film 65a constituting a lower film 65b of the top (second) anti-reflection layer 65 and a silicon oxide film 65b are consecutively formed on the gate electrode layer 60. Then, a photoresist film 82 is formed on the silicon oxide film 65b.

Figure 9B:
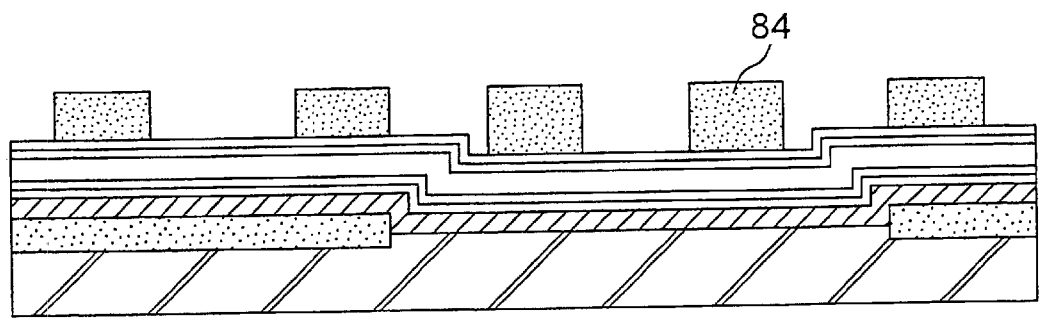
Figure 9C:
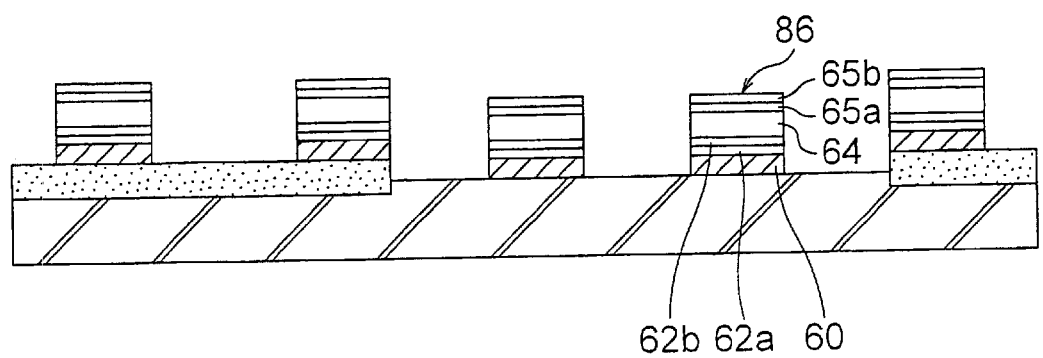

Subsequently, as shown in FIG. 9B, a gate mask pattern is transferred onto the photoresist film 82 by exposure, followed by patterning thereof to form an etching mask 84. The silicon oxide film 65b, silicon oxide nitride film 65a, silicon nitride layer 64, silicon oxide film 62b, silicon oxide nitride film 62a and gate electrode layer 60 are patterned by etching using the etching mask 84 to configure a gate electrode structure 86; as shown in FIG. 9C.

Figure 9D:
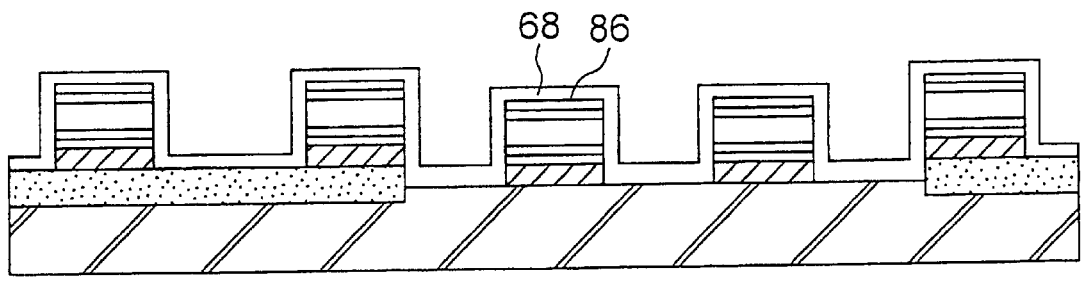
Figure 9E:
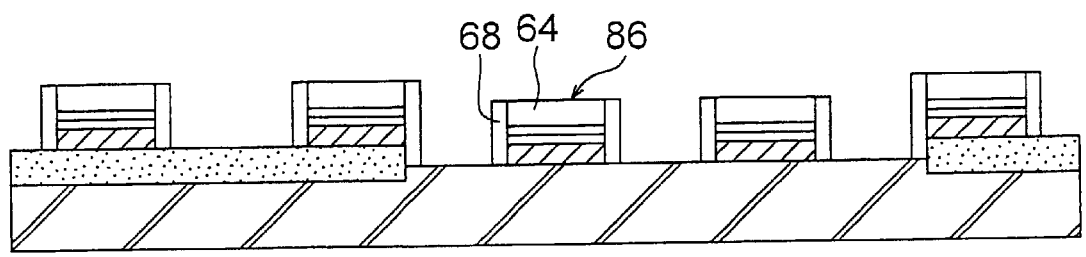

Subsequently, as shown in FIG. 9D, a silicon nitride layer is formed over the entire surface including the gate electrode structure 86, followed by selective etching the silicon nitride layer to configure side walls 68 on the sides of the gate electrode structure 86, and removing the second anti-reflection layer 65, thereby exposing the silicon nitride layer 64, as shown in FIG. 9E.

Figure 9F:
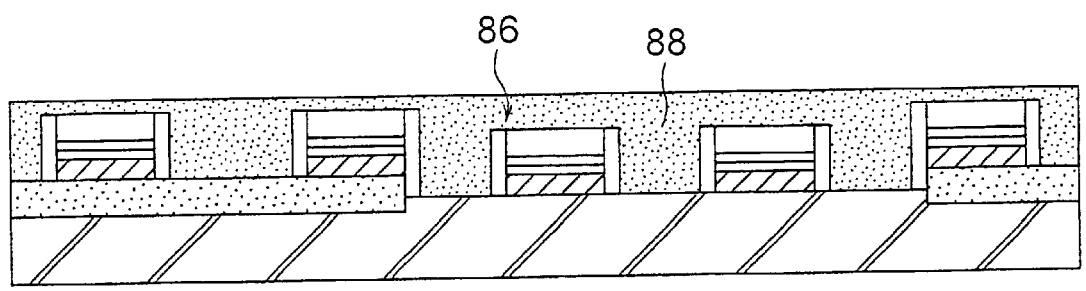
Figure 9G:
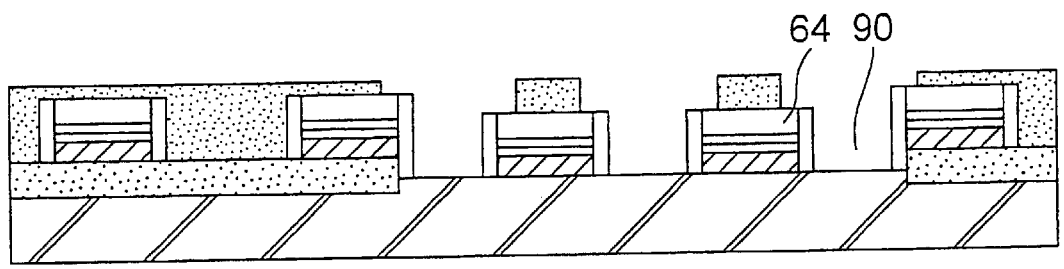
Figure 9H:
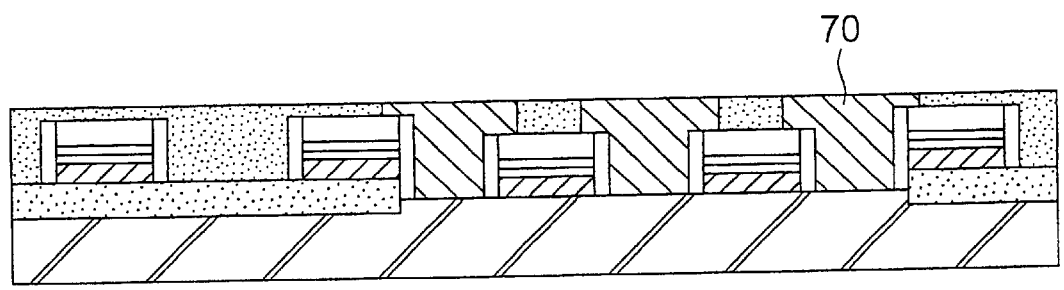

Then, silicon oxide is deposited over the entire surface to form an interlayer dielectric film 88, followed by CMP thereof to obtain a specified thickness for the interlayer dielectric film 88 on the gate electrode structure 86, as shown in FIG. 9F Thereafter, the interlayer dielectric film 88 is etched using, an etching mask (not shown) having a specified mask pattern thereon to form through-holes 90, by using a self-alignment contact etching technique having a high selective ratio between the silicon nitride layer 22 and the interlayer dielectric film 88, thereby obtaining the structure shown in FIG. 9G. In the self-alignment contact etching, the silicon nitride layer 64 functions as an etch stop layer.

Subsequently, a conductive material is deposited on the entire surface to fill the through-holes 90 with the conductive material, followed by etch-back thereof to obtain contact plugs 70.

Further, an interlayer dielectric film 72 is formed on the entire surface, followed by forming storage capacitor 58 by known techniques to obtain the structure shown in FIG. 8.

The DRAM memory cells and the method of the present invention were evaluated by fabricating samples of DRAM memory cells and testing the same with respect to the relationship between the thickness variations of the silicon nitride layer and the width variations of the gate electrode.

First, WSi was sputtered to obtain a WSi film having a thickness of 1500 angstroms as a gate electrode layer 60. Then, a first anti-reflection layer 62 including a 50-angstrom-thick lower silicon oxide nitride film 62a and a 70-angstrom-thick upper silicon oxide film 62b, a 2000-angstrom-thick first silicon nitride layer 64, and a second anti-reflection layer 65 including a 350-angstrom-thick silicon oxide nitride film 65a and a 100-angstrom-thick silicon oxide film 65b were consecutively formed on the gate electrode layer 60. Then, a gate electrode structure 86 was configured based on the above process.

In the above samples, the thicknesses of the silicon oxide nitride film 62a and the silicon oxide nitride film 65a were designed so that the variations of the gate width assumed a minimum when the first silicon nitride layer was 2000 angstroms thick.

Figure 10:
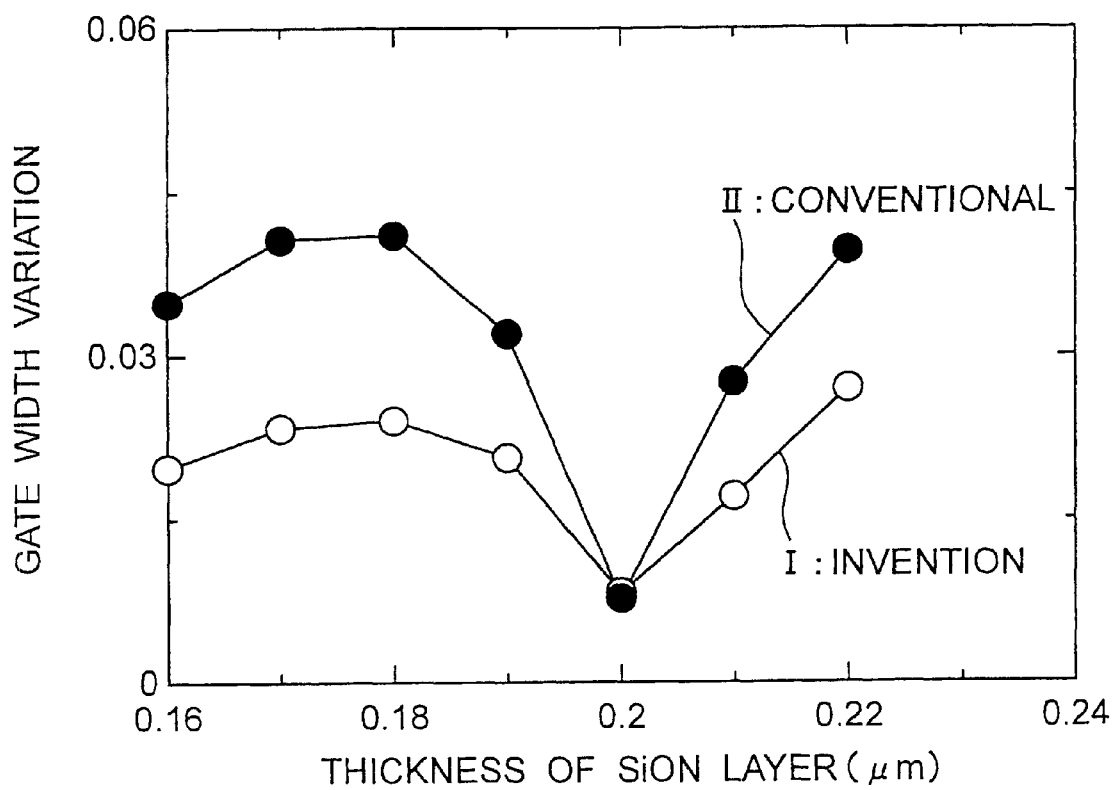
FIG. 10 is a graph showing relationship between the thickness of the silicon nitride layer and the gate width variation.

The relationship between variations of the thickness of the first silicon nitride layer and variations of the gate width was investigated in the present embodiment, the results of which is shown by curve I in FIG. 10.

Figure 1:
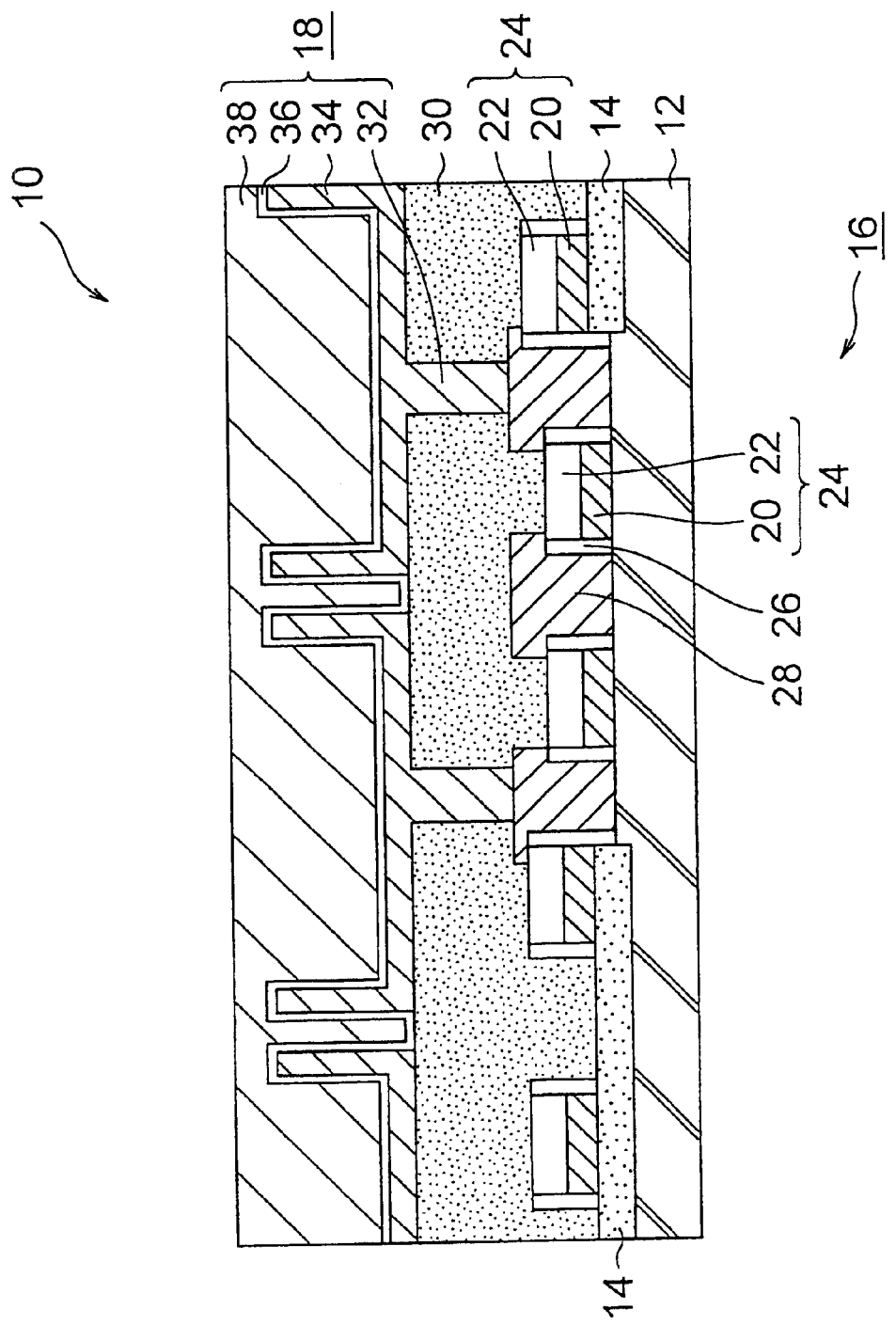
FIG. 1 is a sectional view of a conventional anti-reflection structure in a MOSFET device.
Figure 2A:
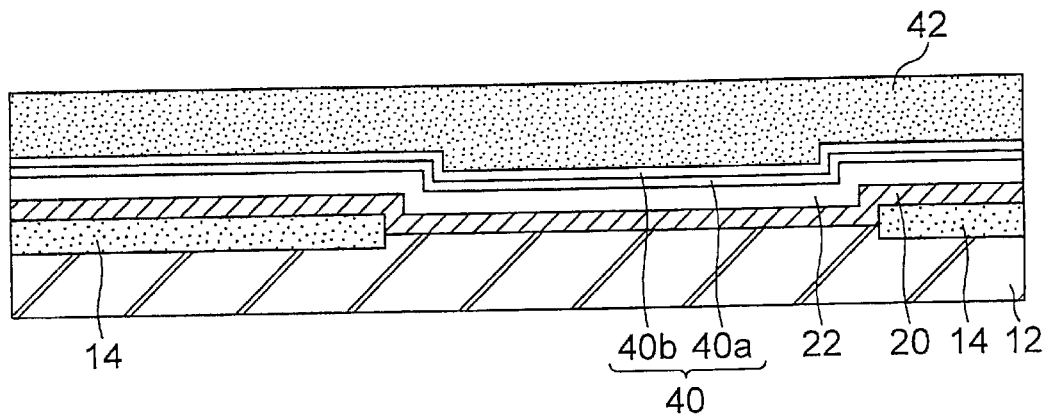
FIGS. 2A to 2F are consecutively steps of fabrication of the MOSFET device of FIG. 1.
Figure 2B:
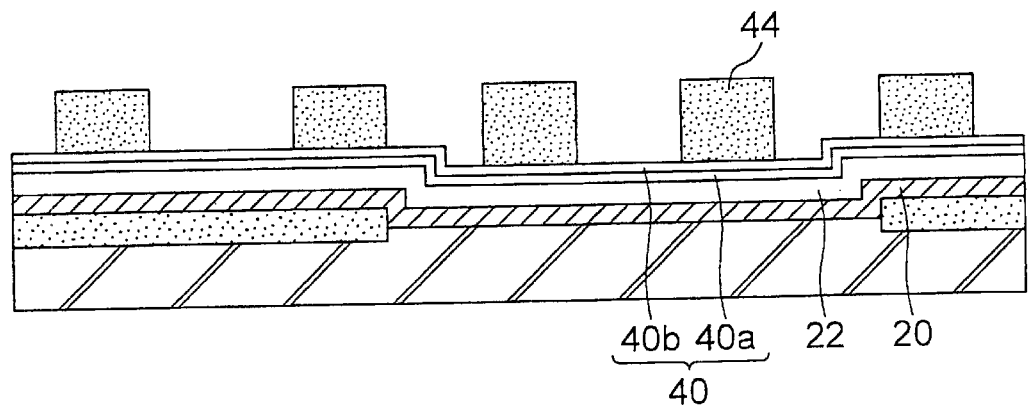
Figure 2C:
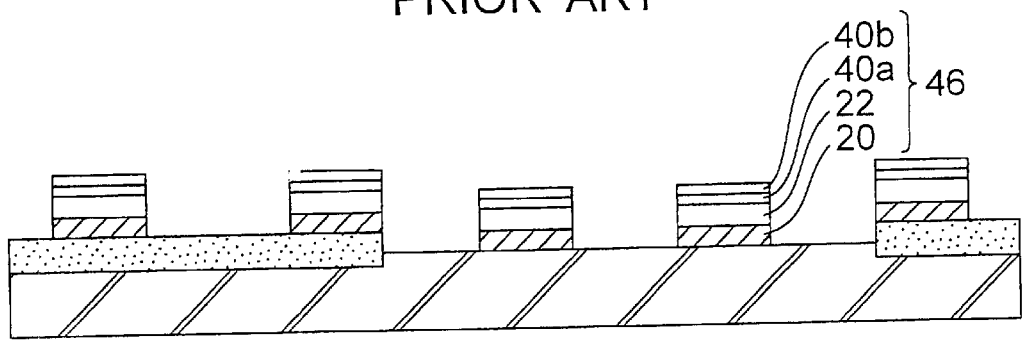
Figure 2D:
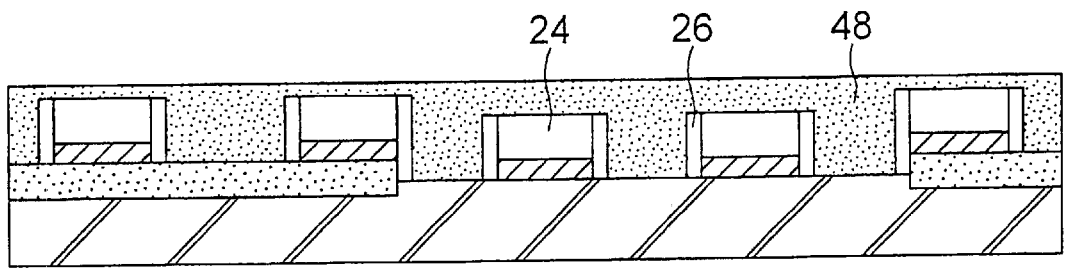
Figure 2E:
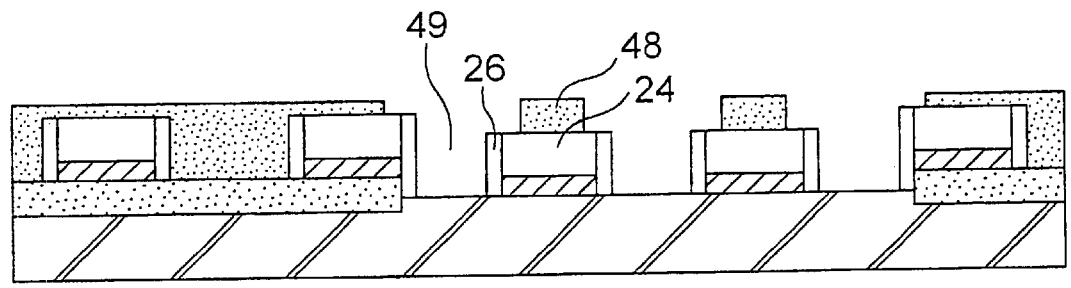
Figure 2F:
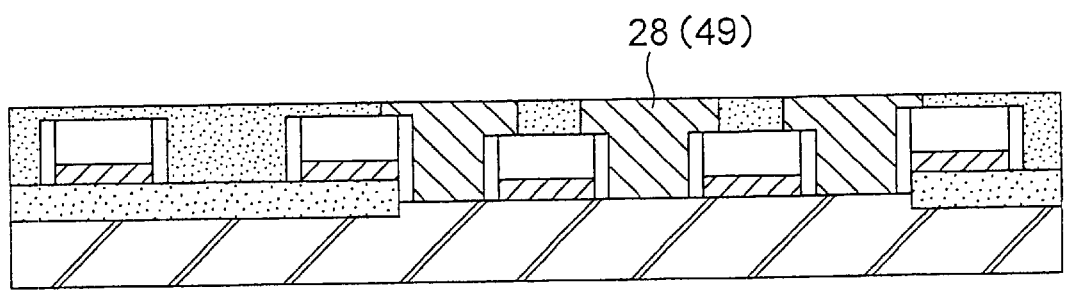

For comparison with the embodiment of the present invention, comparative examples were also fabricated and evaluated similarly. The comparative examples were manufactured based on the process shown in FIGS. 2A to 2C. In the comparative examples, the WSi gate electrode layer 20 was 1500 angstroms thick, and the first silicon nitride layer 22 was 2000 angstroms thick. The anti-reflection layer 40 included a 450-angstrom-thick silicon oxide nitride film 40a and a 100-angstrom-thick silicon oxide film 40b. In the comparative examples, the thickness of the silicon oxide nitride film was designed so that the variations of the gate width assume a maximum when the first silicon oxide nitride film was 2000 angstrom thick. The results of evaluation is shown by curve II in FIG. 10.

As understood from FIG. 10, in the comparative examples, when the thickness of the first silicon nitride layer 22 shifts in a range between 1600 angstroms and 2200 angstroms, the variations of the gate width assume three to four times the variations of the gate width for the first silicon nitride layer having a thickness of 2000 angstroms. However, the variations of the gate width in the samples of the present invention were reduced significantly over the comparative examples having variations in the range between 1600 angstroms and 2200 angstroms of the first silicon nitride layer.

In a modification of the above embodiment, the gate electrode 60 in FIG. 9C is replaced by a metallic interconnect pattern, on which the first anti-reflection layer 62, the first silicon nitride layer 64 and the second anti-reflection layer 65 are formed. The metallic interconnect layer may overlie the silicon substrate with an intervention of one or more layers.

Since the above embodiments are described only for examples, the present invention is not limited to the above embodiments and various modifications or alterations can be easily made therefrom by those skilled in the art without departing from the scope of the present invention.

What is claimed is:

1. A method for manufacturing a semiconductor device comprising the steps of forming a conductive layer overlying a substrate, consecutively forming a first anti-reflection layer, a first insulator layer and a second anti-reflection layer on said conductive layer, forming a mask pattern on said second anti-reflection layer by using a photolithographic technique, and patterning said second anti-reflection layer, said first insulator layer, said first anti-reflection layer and said conductive layer by using said mask pattern, wherein at least one of said first and second anti-reflection layers includes a silicon oxide nitride film and a silicon oxide film formed thereon.

2. The method as defined in claim 1, further comprising the step of removing said second anti-reflection layer.

3. The method as defined in claim 2, wherein said conductive layer is a gate electrode layer in a MOSFET.

4. The method as defined in claim 3 further comprising, after said removing step, the steps of forming a second insulator layer, and patterning said second insulator layer by a self-alignment process using at least said gate electrode layer.

5. The method of claim 1, wherein said second anti-reflective layer comprises a second silicon oxide nitride layer and a second silicon oxide layer formed thereon.

6. A method of making a semiconductor device, comprising the steps of:
   forming a gate electrode on a substrate;
   forming a first anti-reflective layer on the gate electrode, the first anti-reflective layer including a first silicon oxide nitride layer overlain by a first silicon oxide layer;
   forming a silicon nitride layer on the first anti-reflective layer; and
   forming a second anti-reflective layer on the silicon nitride layer, the second anti-reflective layer including a second silicon oxide nitride layer overlain by a second silicon oxide layer.

* * * * *